(12) United States Patent
Heo

(10) Patent No.: US 11,913,994 B2
(45) Date of Patent: Feb. 27, 2024

(54) DIRECT CURRENT CONVERTER CAPABLE OF MONITORING BATTERY CONDITION AND BATTERY CONDITION MONITORING METHOD THEREOF

(71) Applicant: Hyundai Mobis Co., Ltd., Seoul (KR)

(72) Inventor: Min Heo, Yongin-si (KR)

(73) Assignee: HYUNDAI MOBIS Co., Ltd., Seoul (KR)

( * ) Notice: Subject to any disclaimer, the term of this patent is extended or adjusted under 35 U.S.C. 154(b) by 3 days.

(21) Appl. No.: 17/548,953

(22) Filed: Dec. 13, 2021

(65) Prior Publication Data

US 2022/0099744 A1  Mar. 31, 2022

Related U.S. Application Data

(63) Continuation of application No. 16/554,215, filed on Aug. 28, 2019, now Pat. No. 11,585,856.

(30) Foreign Application Priority Data

Oct. 22, 2018  (KR) .......................... 10-2018-0126138

(51) Int. Cl.
*G01R 31/367* (2019.01)
*G01R 31/374* (2019.01)
(Continued)

(52) U.S. Cl.
CPC ......... *G01R 31/367* (2019.01); *G01R 31/374* (2019.01); *G01R 31/389* (2019.01);
(Continued)

(58) Field of Classification Search
CPC ... G01R 31/367; G01R 31/389; H02M 3/156; H02J 7/00
(Continued)

(56) References Cited

U.S. PATENT DOCUMENTS 11,585,856 B2 *  2/2023  Heo ....................... G01R 31/389
2010/0185405 A1 *  7/2010  Aoshima ................. B60L 58/22
702/63

(Continued)

FOREIGN PATENT DOCUMENTS

CN  101359035 A  2/2009
CN  102823103 A  12/2012
(Continued)

OTHER PUBLICATIONS

Korean Office Action dated Feb. 7, 2022 in counterpart Korean Patent Application No. 10-2020-0091770 (3 pages in English, 3 pages in Korean).
(Continued)

*Primary Examiner* — Richard V Muralidar
(74) *Attorney, Agent, or Firm* — NSIP Law

(57) ABSTRACT

A battery condition monitoring apparatus includes a measurer configured to measure a charging current which is an internal current of a converter and is charged into a sub-battery, a charging voltage of the converter, and an ambient temperature of a vehicle, an impedance calculator configured to an impedance of the sub-battery on basis of a voltage and a current each measured by the measurer, and a determiner configured to determine a condition of the sub-battery by using the ambient temperature of the vehicle and the impedance of the sub-battery.

5 Claims, 4 Drawing Sheets

(51) Int. Cl.
*G01R 31/389* (2019.01)
*H02J 7/00* (2006.01)
*H02M 3/156* (2006.01)

(52) U.S. Cl.
CPC .............. *H02J 7/00* (2013.01); *H02M 3/156* (2013.01); *H02J 2207/20* (2020.01)

(58) Field of Classification Search
USPC ................................. 320/103, 132; 324/430
See application file for complete search history.

(56) References Cited

U.S. PATENT DOCUMENTS

| | | | | |
|---|---|---|---|---|
| 2012/0306450 | A1* | 12/2012 | Nakayama | G01R 31/382 320/134 |
| 2013/0026828 | A1 | 1/2013 | Iwami | |
| 2014/0125284 | A1* | 5/2014 | Qahouq | H02J 7/0018 320/118 |
| 2015/0008929 | A1 | 1/2015 | Ehrmann et al. | |
| 2015/0233993 | A1 | 8/2015 | Lee et al. | |
| 2016/0052505 | A1* | 2/2016 | Zhou | B60L 15/2045 903/930 |
| 2016/0103186 | A1* | 4/2016 | Hong | H01M 10/425 324/430 |
| 2017/0264104 | A1 | 9/2017 | Horitake et al. | |
| 2018/0301986 | A1* | 10/2018 | Alves | H02J 7/0068 |

FOREIGN PATENT DOCUMENTS

| | | |
|---|---|---|
| CN | 102983599 A | 3/2013 |
| CN | 103837833 A | 6/2014 |
| CN | 104114399 A | 10/2014 |
| CN | 104158397 A | 11/2014 |
| CN | 104849668 A | 8/2015 |
| CN | 205039570 U | 2/2016 |
| CN | 107181312 A | 9/2017 |
| JP | 2016-157564 A | 9/2016 |
| KR | 10-2008-0028108 A | 3/2008 |
| KR | 10-2012-0071600 A | 7/2012 |
| KR | 10-2015-0097927 A | 8/2015 |
| KR | 10-2017-0048866 A | 5/2017 |

OTHER PUBLICATIONS

He, Limin "Selected Microcontroller Application Technology 10" Beijing University of Aeronautics and Astronautics Press Mar. 31, 2004 (18 pages in English, 11 pages in Mandarin).

Shan, Guifeng et al. "New Energy Vehicle Application Technology" Tianjin Science and Technology Press Jul. 31, 2017 (8 pages in English, 6 pages in Mandarin).

Korean Office Action dated Aug. 18, 2021 in counterpart Korean Patent Application No. 10-2020-0091770 (4 pages in Korean).

Chinese Office Action dated Aug. 23, 2021 in counterpart Chinese Patent Application No. 201911005083.2 (9 pages in English and 11 pages in Chinese).

Korean Office Action dated Jul. 19, 2022, in counterpart Korean Patent Application No. 10-2020-0091770 (3 pages in English and 3 pages in Korean).

Chinese Office Action dated Aug. 19, 2022, in counterpart Chinese Patent Application No. 201911005083.2 (12 pages in English and 9 pages in Chinese).

Korean Office Action dated Dec. 19, 2022, in counterpart Korean Patent Application No. 10-2018-0126138 (5 pages in Korean).

Chinese Office Action dated Apr. 2, 2022, in counterpart Chinese Patent Application No. 201911005083.2 (13 pages in English and 11 pages in Chinese).

* cited by examiner

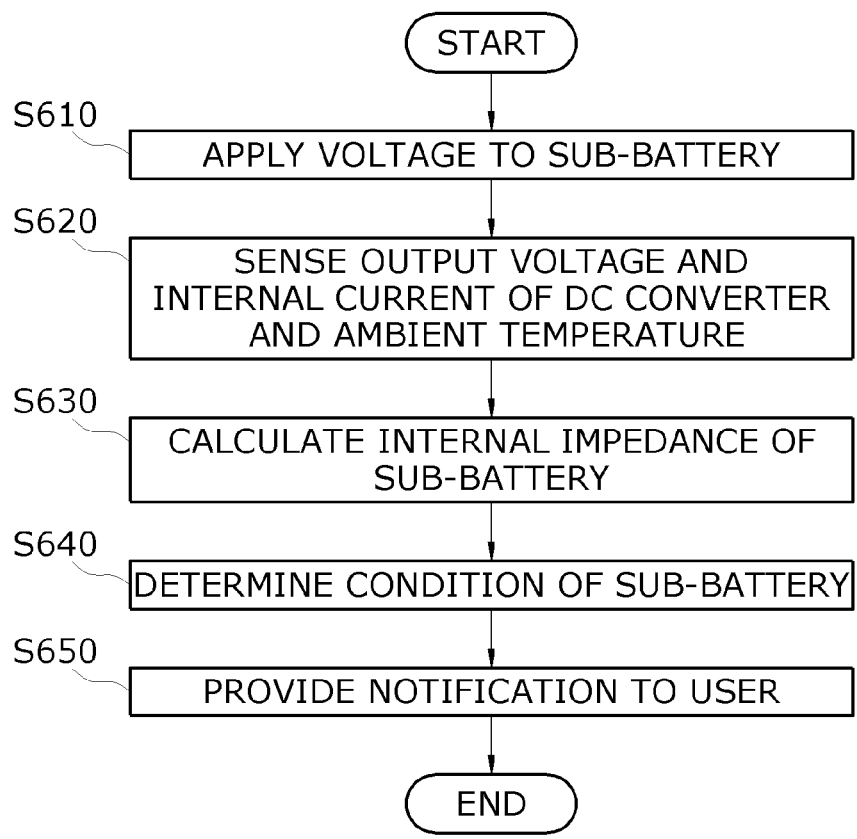

DIRECT CURRENT CONVERTER CAPABLE OF MONITORING BATTERY CONDITION AND BATTERY CONDITION MONITORING METHOD THEREOF

CROSS-REFERENCE TO RELATED APPLICATIONS

This application is a continuation of U.S. patent application Ser. No. 16/554,215 filed on Aug. 28, 2019, which claims the benefit under 35 USC § 119(a) of Korean Patent Application No. 10-2018-0126138, filed on Oct. 22, 2018, in the Korean Intellectual Property Office, the entire disclosure of which is incorporated herein by reference for all purposes.

TECHNICAL FIELD

The present invention relates to a direct current (DC) converter which monitors a battery condition to provide a driver with the battery condition and a possibility of discharging of the battery.

BACKGROUND

A 48V mild hybrid system includes a 48V main battery which supplies an auxiliary power for driving of a vehicle and supplies energy to a 48V electronic element of the vehicle, a 12V sub-battery which supplies energy to a 12V electronic element of the vehicle, and a DC converter disposed therebetween. Here, when an electronic load of a 12V battery increases, the DC converter operates in a buck mode to drop an input voltage of 48 V to an output voltage of 12 V and supplies power to a 12V electronic element, and when an electronic load of a 48V battery increases, the DC converter operates in a boost mode to boost an input voltage of 12 V to an output voltage of 48 V and may supplies power to a 48V electronic element.

The 12V battery has a chemical characteristic where, as a charging/discharging cycle (the number of charging/discharging) increases, a voltage decreases, and thus, an internal impedance of the battery increases. Also, due to an increase in the internal impedance of the battery, when a driver starts an engine, a voltage of the battery is rapidly reduced and is discharged. Accordingly, by monitoring a condition of the 12V battery, it is required to repair or replace the battery before a problem caused by the discharging and aging of the battery occurs.

However, in a related art 48V mild hybrid system, since a condition of the 12V battery should be inevitably monitored or a separate element for monitoring the condition of the 12V battery should be provided, there is a problem where the material cost and a weight of a vehicle increase.

Moreover, since a converter is used as only a function of supplying a power of the 12V battery, technology for monitoring a condition of the 12V battery with the converter is needed.

SUMMARY

Accordingly, the present invention provides a battery condition monitoring apparatus and method using a DC converter, which monitor a condition of a 12V battery by using a converter to previously provide a user with the condition of the 12V battery and a possibility of discharging of the 12V battery.

The object of the present invention is not limited to the aforesaid, but other objects not described herein will be clearly understood by those skilled in the art from descriptions below.

In one general aspect, a DC converter disposed between a main battery and a sub-battery includes a conversion unit configured to convert an output voltage of the main battery into a charging voltage of the sub-battery and a monitoring unit configured to measure a charging current and the charging voltage each applied from the conversion unit to the sub-battery and an ambient temperature of the sub-battery, calculate an impedance of the sub-battery by using the charging voltage and the charging current, and determine a condition of the sub-battery by using the ambient temperature and the impedance.

The monitoring unit may include a measurer configured to measure the charging voltage, the charging current, and the ambient temperature, a calculator configured to the impedance of the sub-battery on basis of the charging voltage and the charging current, and a determiner configured to determine the condition of the sub-battery.

The determiner may determine the condition of the sub-battery by using a determination table where an impedance range representing a normal state and an aging state of the sub-battery is defined based on the ambient temperature.

The monitoring unit may further include a storage configured to store the determination table.

The measurer may measure voltages at both ends of a capacitor which is provided in the DC converter and is connected to the sub-battery in parallel.

The determiner may calculate and provide a value of the charging current of the sub-battery as a rate representing a degree of aging of the sub-battery.

In another general aspect, a battery condition monitoring method using a direct current (DC) converter, disposed between a main battery and a sub-battery, includes measuring a charging current and a charging voltage each applied from the DC converter to the sub-battery and an ambient temperature of the sub-battery, calculating an impedance of the sub-battery by using the charging voltage and the charging current, and determining a condition of the sub-battery by using the ambient temperature and the impedance.

The determining may include determining the condition of the sub-battery by using a determination table where an impedance range representing a normal state and an aging state of the sub-battery is defined based on the ambient temperature.

The measuring may include measuring voltages at both ends of a capacitor connected to the sub-battery in parallel, for measuring the charging voltage.

The determining may include calculating and providing a value of the charging current of the sub-battery as a rate representing a degree of aging of the sub-battery.

Other features and aspects will be apparent from the following detailed description, the drawings, and the claims.

BRIEF DESCRIPTION OF THE DRAWINGS

FIG. 6 is a flowchart illustrating a battery condition monitoring method according to an embodiment of the present invention.

DETAILED DESCRIPTION OF EMBODIMENTS

The advantages, features and aspects of the present invention will become apparent from the following description of the embodiments with reference to the accompanying drawings, which is set forth hereinafter.

However, the present invention may be embodied in different forms and should not be construed as limited to the embodiments set forth herein. Rather, these embodiments are provided so that this disclosure will be thorough and complete, and will fully convey the scope of the present invention to those skilled in the art.

The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a DC converter and a battery condition monitoring method using the same according to embodiments of the present invention will be described in detail with reference to the accompanying drawings.

Figure 1:
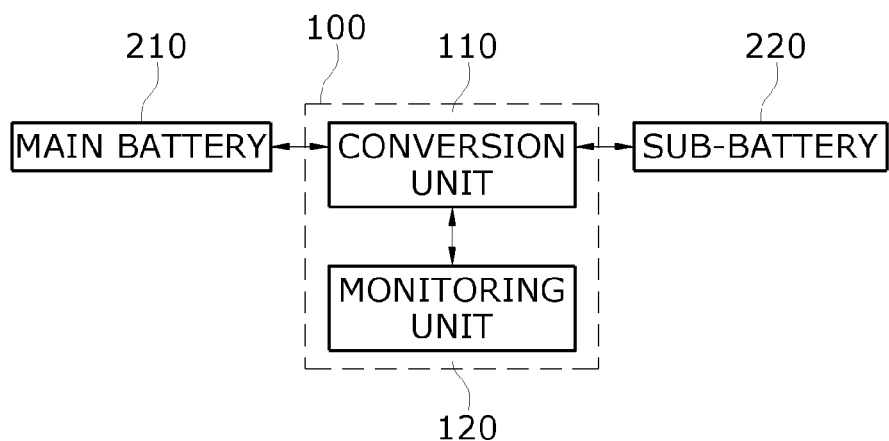
FIG. 1 is a block diagram of a DC converter according to an embodiment of the present invention.

FIG. 1 is a block diagram of a DC converter 100 according to an embodiment of the present invention.

As illustrated in FIG. 1, the DC converter 100 according to an embodiment of the present invention may include a conversion unit 110 and a monitoring unit 120.

The conversion unit 110 may convert a voltage, input from a main battery 210, into a charging voltage (or an output voltage) for charging a sub-battery 220.

An output voltage of the main battery 210 may be higher than a charging voltage of the sub-battery 220, and thus, the conversion unit 110 may drop a voltage of the main battery 210 so as to be suitable for charging of the sub-battery 220 and may apply a dropped voltage to the sub-battery 220.

The DC converter 100 according to an embodiment of the present invention may measure a charging current of the sub-battery 220 to determine a condition of the sub-battery 220 based thereon. Here, the charging current may be a current flowing from the main battery 210 to the sub-battery 220 and may be measured with an ammeter A1. This will be described below in detail with reference to FIG. 3.

The monitoring unit 120 may measure a voltage applied to the sub-battery 220 through the conversion unit 110 and an air temperature (an ambient temperature) outside the sub-battery 220 and may calculate an internal impedance of the sub-battery 220 on the basis of a measured value.

The monitoring unit 120 may determine a condition of the sub-battery 220 by using the measured ambient temperature and the calculated internal impedance of the sub-battery 220. Here, a voltage and a current each applied from the main battery 210 to the sub-battery 220 through the conversion unit 110 may be used to charge the sub-battery 220 and may be respectively referred to as a charging voltage and a charging current.

In measuring the ambient temperature of the sub-battery 220 by using the monitoring unit 210, a measurement temperature may vary based on a distance apart from the sub-battery 220, and thus, it may be required to select a suitable temperature measurement point in designing an apparatus, whereby a desired measurement point may be selected through an experiment.

Figure 2:
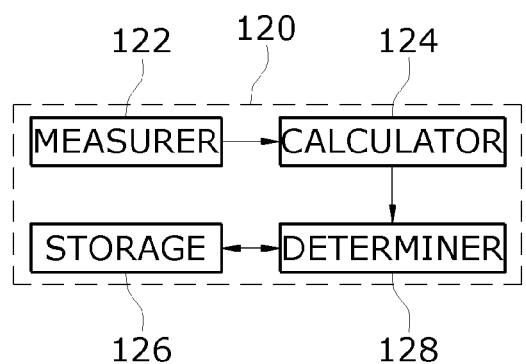
FIG. 2 is a block diagram illustrating a detailed configuration of a monitoring unit illustrated in FIG. 1.

FIG. 2 is a block diagram illustrating a detailed configuration of the monitoring unit 120 illustrated in FIG. 1.

Referring to FIG. 2, the monitoring unit 120 may include a measurer 122, a calculator 124, a storage 126, and a determiner 128, for determining a condition of the above-described sub-battery 220.

The measurer 122 may measure an internal voltage of the conversion unit 110, for measuring a charging current of the sub-battery 220.

In detail, the conversion unit 110 may drop a voltage input from the main battery 210 to apply a dropped voltage to the sub-battery 220, and thus, the measurer 122 may measure a voltage applied to the sub-battery 220. To this end, the measurer 122 may use, for example, a voltage sensor.

When an output voltage of the conversion unit 110 is applied to the sub-battery 220 and thus the sub-battery 220 starts to be charged, the measurer 110 may measure an internal current of the DC converter 100 as the charging current of the sub-battery 220.

To this end, the measurer 110 may use, for example, a current sensor A1 based on a shunt method or a hall method. Also, the measurer 110 may use, for example, a temperature sensor so as to measure the ambient temperature of the sub-battery 220. However, the above-described methods and sensors are merely an embodiment, and in addition, various methods may be used for measuring an internal current and an output voltage of the DC converter 100 and the ambient temperature of the sub-battery 220.

The calculator 124 may calculate the internal impedance of the sub-battery 220 by using a charging current and a charging voltage value (or an output voltage value) of the sub-battery 220 measured by the measurer 110. Calculating of impedance may use the following Equation (1).

$$Z = \frac{V}{I} \qquad \text{[Equation 1]}$$

Here, Z may denote the internal impedance of the sub-battery 220, I may denote the charging current of the sub-battery 220, and V may denote an output voltage of the DC converter 100.

The storage 126 may store a determination table for determining a condition of the sub-battery 220.

Here, the determination table may define an internal impedance range of when the sub-battery 220 is in a normal state and an internal impedance range of when the sub-battery 220 is in an aging state, with respect to an ambient temperature measured by the measurer 110.

The determiner 128 may determine an aging state of the sub-battery 220 by using the determination table of the storage 126 and an internal impedance value of the sub-battery 220 received from the calculator 124.

The following Table 1 may represent a determination table which is used for the determiner 128 to determine a condition of the sub-battery 220 and may represent an example easy to compare among a plurality of experiment results.

TABLE 1

| Ambient temperature [° C.] | Normal battery | | Aging battery | |
|---|---|---|---|---|
| | Charging current [A] | Impedance [Ω] | Charging current [A] | Impedance [Ω] |
| −20 | 10 | 1.40 | 1.7 | 8.24 |
| 25 | 16.7 | 0.84 | 2.5 | 5.00 |
| 60 | 40 | 0.35 | 010 | 1.40 |

Referring to Table 1, a value of the internal impedance of the sub-battery 220 which is determined as having a normal state at a temperature of −20° C. is 1.40Ω, and a value of the charging current is 10 A. On the other hand, it may be seen that the internal impedance value of the sub-battery 220 which is determined as having an aging state is 8.24Ω, and in this case, the charging current is 1.7 A. Similarly, in the determination table of Table 1, it may be seen that values of the internal impedance and charging current of the sub-battery 220 are defined with respect to the ambient temperature of 25° C. and 60° C. The determiner 128 may determine a condition of the sub-battery 220 by using the determination table.

For example, in a state where the ambient temperature is measured as 25° C., when the internal impedance value of the sub-battery 220 is 0.84Ω, the determiner 128 may determine the sub-battery 220 as having a normal state.

Hereinafter, a process of measuring a charging current and a charging voltage of a sub-battery by using a DC converter according to an embodiment of the present invention will be described with reference to FIG. 3.

Figure 3:
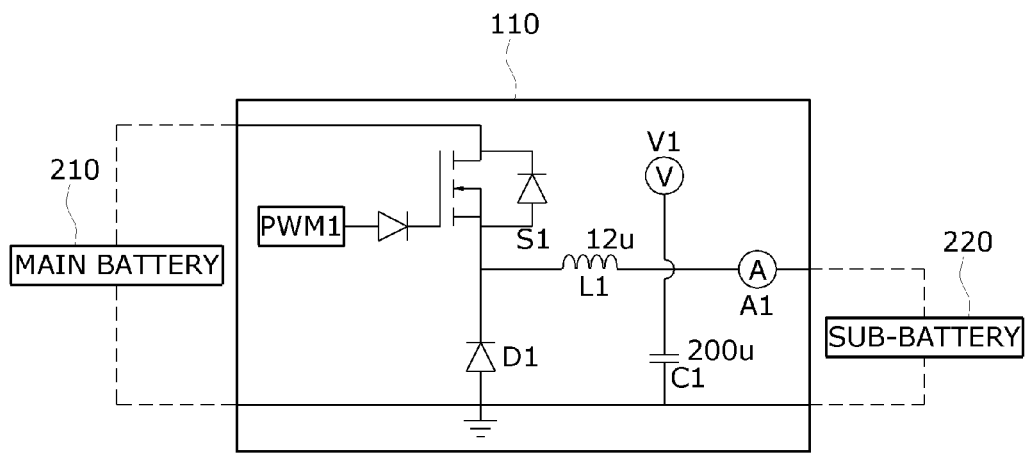
FIG. 3 is a diagram for describing a conversion unit according to an embodiment of the present invention.

FIG. 3 is a diagram for describing a conversion unit according to an embodiment of the present invention.

Referring to FIG. 3, a central circuit 110 may represent a conversion unit 110 according to an embodiment of the present invention, and a main battery 210 and a sub-battery 220 may be respectively connected to one side (a left side in FIG. 3) and the other side (a right side in FIG. 3) of the conversion unit 110. The conversion unit 110 may be referred to as a circuit including a switching element S1, a diode D1, an inductor L1, and a capacitor C1, but is not limited thereto. For example, the conversion unit 110 may be referred to as a circuit which drops a voltage of the main battery 210 to supply a dropped voltage to the sub-battery 220 and boosts a voltage of the sub-battery 220 to supply a boosted voltage to the main battery 210.

As illustrated in FIG. 3, an output of the conversion unit 110 may be connected to the sub-battery 220 as one contact (the same node), and the main battery 210 may be a power source for charging the sub-battery 220. Therefore, when the DC converter 100 outputs a controlled voltage, the controlled voltage may be applied to the sub-battery 220, and thus, may be monitored. For example, voltages at both ends of the capacitor C1 connected to the sub-battery 220 in parallel may be monitored by a voltmeter V1, and thus, a charging voltage of the sub-battery 220 may be measured. Also, an internal current of the conversion unit 110 may be monitored by an ammeter A1, and thus, a charging current value of the sub-battery 220 may be monitored. Therefore, by using the DC converter 100, a possibility of discharging of the sub-battery 220 and the aging or not of the sub-battery 220 may be provided to a user. Also, a monitoring element which is separately included in a related art 48V mild hybrid system so as to monitor a condition of a sub-battery may be omitted, and thus, the material cost and a weight of a vehicle may decrease.

In FIG. 3, the voltmeter V1 and the ammeter A1 are illustrated as a method of measuring a charging voltage and a charging current of the sub-battery 220, but are not limited thereto. In other embodiments, various sensors for sensing a voltage and a current may be used.

Figure 4:
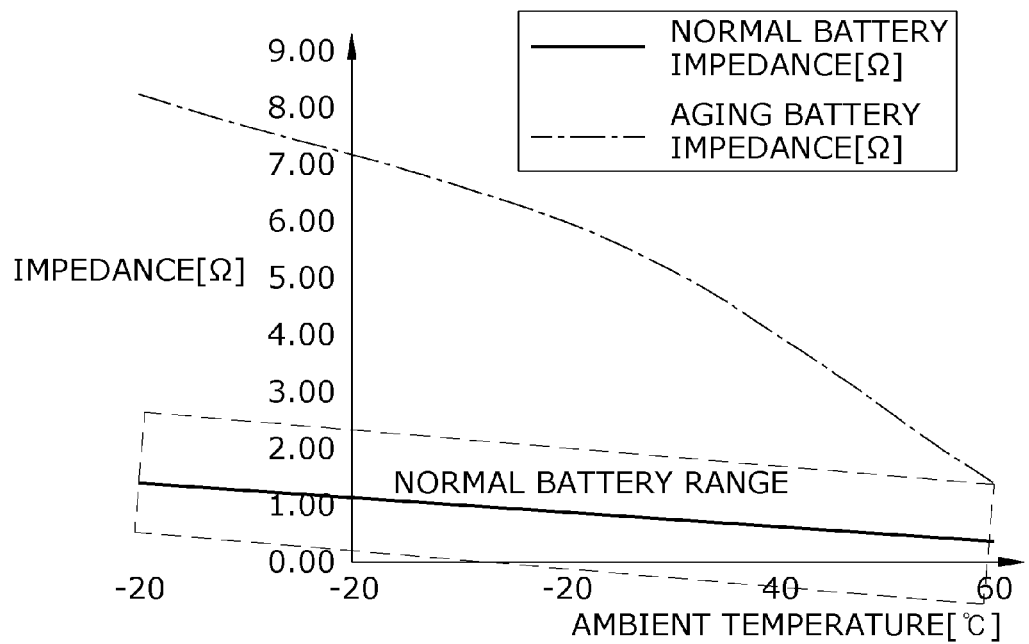
FIG. 4 is a graph showing a relationship between an impedance and an ambient temperature of a sub-battery according to an embodiment of the present invention.

FIG. 4 is a graph showing a relationship between an impedance and an ambient temperature of a sub-battery according to an embodiment of the present invention.

To provide description with reference to FIG. 4, it may be seen that an impedance value of the sub-battery 220 having a normal state is shown in a shape close to a horizontal line at a lower end of the graph of FIG. 4, but an impedance value of the sub-battery 220 having an aging state is shown in a right downward shape at an upper end of the graph of FIG. 4. As described above, an internal impedance value of the sub-battery 220 having the normal state may differ from an internal impedance value of the sub-battery 220 having the aging state, and thus, the aging or not of the sub-battery 220 may be determined based on an internal impedance value of the sub-battery 220. Also, it may be seen that a difference is not large because a shape of the graph is close to a horizontal line in the normal state, but in the aging state, a difference is large. Accordingly, the DC converter 100 according to an embodiment of the present invention may measure an ambient temperature of the sub-battery 220 and may reflect the measured ambient temperature in determining a condition of the sub-battery 220, thereby correcting an error caused by the ambient temperature.

Figure 5A:
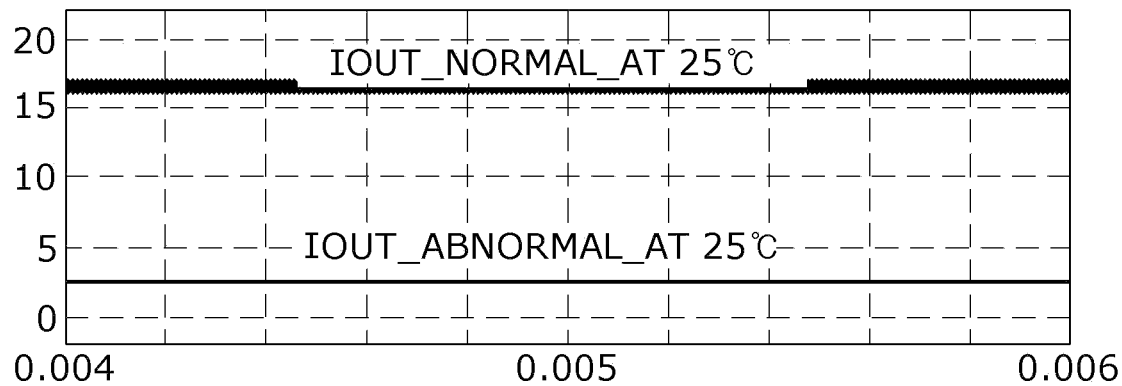
FIGS. 5A, 5B and 5C are graphs showing a result obtained by comparing a charging current value based on a normal state with a charging current value based on an aging state with respect to an ambient temperature in a sub-battery according to an embodiment of the present invention.
Figure 5B:
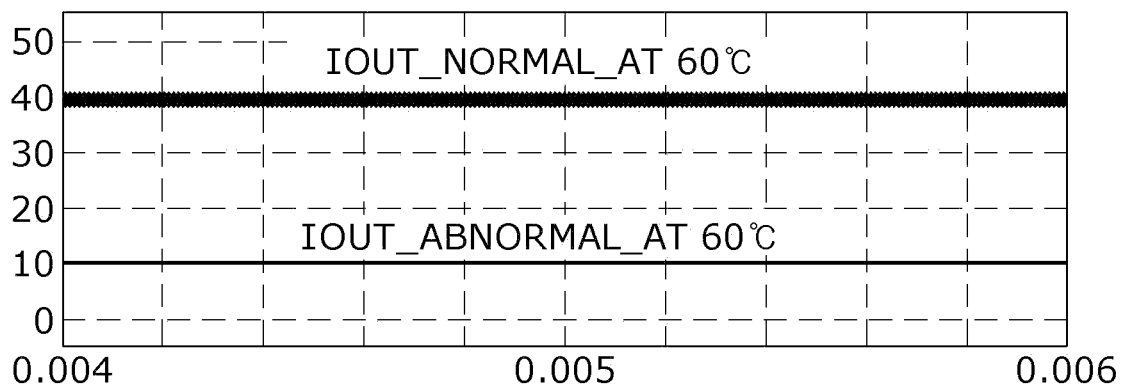
Figure 5C:
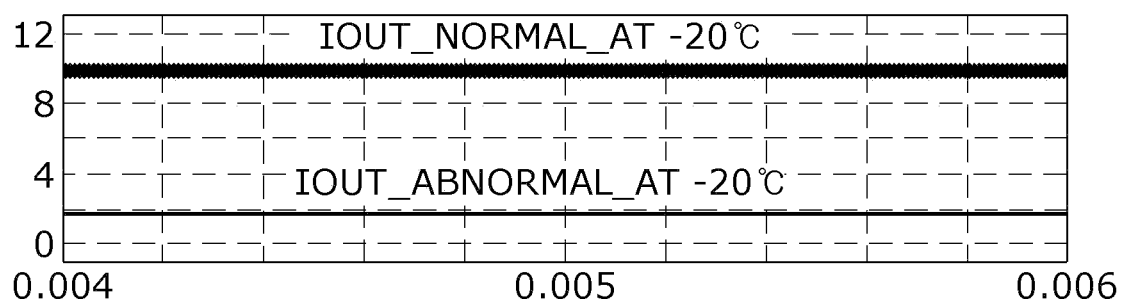

FIGS. 5A, 5B and 5C are graphs showing a result obtained by comparing a charging current value based on a normal state with a charging current value based on an aging state with respect to an ambient temperature in a sub-battery according to an embodiment of the present invention.

To provide description with reference to FIGS. 5A, 5B and 5C, a graph at an upper end of FIG. 5A shows a charging current value (Iout_normal_at 25° C.) of the sub-battery 220 having a normal state and a charging current value (Iout_abnormal_at 25° C.) of the sub-battery 220 having an aging state at an ambient temperature of 25° C., and it may be seen that two straight lines parallel to each other are shown. Accordingly, a determination table for determining a condition of the sub-battery 220 may be generated by using a charging current value represented by each of the two straight lines parallel to each other.

The above-described determination table may define an internal impedance range of when the sub-battery 220 is in the normal state and an internal impedance range of when the sub-battery 220 is in the aging state, with respect to a set ambient temperature, but in addition to simply determining the normal state and the aging state of the sub-battery 220, a degree of aging of a battery may be represented as a rate. For example, at the same ambient temperature, a value of a charging current of the sub-battery 220 having the normal state may be set to 100% and a value of a charging current of the sub-battery 220 having the aging state may be set to 0%, and under such a condition, a value of a charging current of the sub-battery 220 may be calculated as a rate representing a degree of aging of a battery and may be provided to a user.

Hereinafter, a battery condition monitoring method according to an embodiment of the present invention will be described with reference to FIG. 6.

FIG. 6 is a flowchart illustrating a battery condition monitoring method according to an embodiment of the present invention.

In describing the battery condition monitoring method with reference to the flowchart of FIG. 6, descriptions which are the same as or similar to descriptions of FIGS. 1 to 3 may be omitted.

As illustrated in FIG. 6, the DC converter 100 according to an embodiment of the present invention may convert a voltage, input from the main battery 210, into a charging voltage of the sub-battery 220 and may apply the charging voltage to the sub-battery 220 in step S610.

According to an embodiment of the present invention, the DC converter 100 may be a power source for charging the sub-battery 220, and when a voltage controlled or output by the DC converter 100 is applied to the sub-battery 220, a charging voltage value and a charging current value of the sub-battery 220 may be monitored by using the DC converter 100.

When a voltage is applied to the sub-battery 220, the measurer 110 may measure an internal current and an output voltage of the DC converter 100 and an ambient temperature of the sub-battery 220 in step S620.

To describe a measurement method of the measurer 110 in detail, the measurer 110 may measure an output voltage of the DC converter 100 by using, for example, a voltage sensor. Also, when an output voltage of the DC converter 100 is applied to the sub-battery 220 and thus the sub-battery 220 starts to be charged, the measurer 110 may measure an internal current of the DC converter 100. To this end, the measurer 110 may use, for example, the shunt method or the hall method. Also, the measurer 110 may use, for example, a temperature sensor so as to measure the ambient temperature of a vehicle.

Subsequently, in step S630, the calculator 124 may calculate an internal impedance of the sub-battery 220.

The internal impedance of the sub-battery 220 may be calculated by using the output voltage of the DC converter 100 and the charging current value of the sub-battery 220 monitored by the DC converter 100, and thus, a possibility of discharging of the sub-battery 220 and the aging or not of the sub-battery 220 may be provided to a user. Also, a monitoring element which is separately included in a related art 48V mild hybrid system so as to monitor a condition of a sub-battery may be omitted, and thus, the material cost and a weight of a vehicle may decrease.

An impedance value of the sub-battery 220 may be calculated based on Equation (1) described above with reference to FIG. 2.

Subsequently, in step S640, the determiner 120 may determine the aging or not of the sub-battery 220 by using the calculated impedance value of the sub-battery 220 and the determination table stored in the storage 126.

An operation of determining the aging or not of the sub-battery 220 may use the determination table such as Table 1 described above.

In such a process, instead of simply determining the normal state and the aging state of the sub-battery 220, a degree of aging of a battery may be represented as a rate. For example, at the same ambient temperature, a value of a charging current of the sub-battery 220 having the normal state may be set to 100% and a value of a charging current of the sub-battery 220 having the aging state may be set to 0%, and under such a condition, a value of a charging current of the sub-battery 220 may be calculated as a rate representing a degree of aging of a battery and may be provided to a user.

Finally, a result of determination by the determiner 128 may be provided to the user in step S650.

As described above, according to embodiments of the present invention, a condition of the sub-battery 220 may be monitored by using the DC converter 100 and may be provided to the user.

In the above description, steps S610 to S650 may be further divided into additional steps on the basis of an implementation embodiment of the present invention, or may be combined into fewer steps. Also, some steps may be omitted depending on the case, and the order of steps may be changed. Furthermore, description given already with reference to FIGS. 1 to 3 among other emitted descriptions may also be applied to a battery condition monitoring method performed by the battery condition monitoring apparatus of FIG. 6.

The monitoring unit 120 according to an embodiment of the present invention may be configured with a memory (not shown) and a processor (not shown) for executing a program stored in the memory.

Here, the memory may denote a generic name for a volatile memory device and a non-volatile memory device which continuously maintains stored information even when power is cut off. Examples of the memory may include NAND flash memory such as compact flash (CF) card, secure digital (SD) card, memory stick, solid state drive (SSD), and micro SD card, magnetic computer memory device such as hard disk drive (HDD), and optical disc drive such as CD-ROM and DVD-ROM. For reference, the elements according to an embodiment of the present invention illustrated in FIG. 2 may be implemented as software or a hardware type such as field programmable gate array (FPGA) or application specific integrated circuit (ASIC) and may perform certain functions.

According to the embodiments of the present invention, the DC converter may monitor a condition of the 12V battery to determine the condition of the 12V battery based on an ambient temperature of a vehicle and may provide a user with the condition of the 12V battery and a possibility of discharging of the 12V battery.

Moreover, according to the embodiments of the present invention, the conventional replacement alarm element and monitoring element of the 12V battery may be omitted, and thus, the material cost and a weight of a vehicle may be reduced.

The foregoing description of the present invention is for illustrative purposes, those with ordinary skill in the technical field of the present invention pertains in other specific forms without changing the technical idea or essential features of the present invention that may be modified to be able to understand. Therefore, the embodiments described above, exemplary in all respects and must understand that it is not limited. For example, each component may be distributed and carried out has been described as a monolithic and describes the components that are to be equally distributed in combined form, may be carried out.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A battery condition monitoring apparatus disposed between a main battery and a sub-battery, the battery condition monitoring apparatus comprising:
a measurer configured to measure an ambient temperature of the sub-battery, a charging voltage applied from a direct current (DC) converter to the sub-battery, and a charging current flowing to the sub-battery from the main battery;
a calculator configured to calculate an impedance of the sub-battery by using the charging voltage and the charging current; and
a determiner configured to determine a condition of the sub-battery by considering at least one of the charging current according to the ambient temperature and the impedance according to the ambient temperature,
wherein the determiner determines the condition of the sub-battery based on impedances corresponding to the measured ambient temperature which are defined in a determination table and the calculated impedance; and
wherein the determination table defines a first impedance, corresponding to each ambient temperature, at which the sub-battery is determined to be in a normal slate, and defines a second impedance, corresponding to each ambient temperature, at which the sub-battery is determined to be in an acting state.

2. The battery condition monitoring apparatus of claim 1, further comprising:
a storage configured to store the determination table.

3. The battery condition monitoring apparatus of claim 1, wherein the measurer measures voltages at both ends of a capacitor which is connected to the sub-battery in parallel for measuring the charging voltage.

4. The battery condition monitoring apparatus of claim 1, wherein the determiner calculates and provides a value of the charging current of the sub-battery as a rate representing a degree of aging of the sub-battery.

5. A method, the method comprising:
measuring an ambient temperature of a sub-battery;
measuring a charging voltage from a direct current (DC) converter provided to the sub-battery and a charging current flowing from a main battery to the sub-battery; and
determining a condition of the sub-battery by considering at least one of the charging current according to the ambient temperature and the charging voltage according to the ambient temperature,
wherein the condition the sub-battery is determined based on charging currents corresponding to the measured ambient temperature which are defined in a determination table and the measured charging current; and
wherein the determination table defines a charging current corresponding to each ambient temperature, at which the sub-battery is determined to be in a normal state, and defines a second charging current, corresponding to each ambient temperature, at which the sub-battery is determined to be in an aging state.

* * * * *